(12) United States Patent
Willer

(10) Patent No.: US 6,359,296 B1
(45) Date of Patent: Mar. 19, 2002

(54) CIRCUIT ARRANGEMENT WITH AT LEAST ONE CAPACITOR

(75) Inventor: Josef Willer, Riemerling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/250,516

(22) Filed: Feb. 16, 1999

(30) Foreign Application Priority Data

Feb. 16, 1998 (DE) .......................................... 198 06 307

(51) Int. Cl.$^7$ ............................................... H01L 21/20
(52) U.S. Cl. ...................... 257/295; 257/752; 257/763; 257/915
(58) Field of Search ................................. 257/295, 310, 257/752, 763, 915; 438/396, 393

(56) References Cited

U.S. PATENT DOCUMENTS

| | | | | |
|---|---|---|---|---|
| 5,347,696 A | * | 9/1994 | Willer et al. ................ | 29/25.42 |
| 5,382,817 A | * | 1/1995 | Kashihara et al. .......... | 257/295 |
| 5,566,045 A | | 10/1996 | Summerfelt et al. | |
| 5,696,017 A | * | 12/1997 | Ueno .......................... | 438/253 |
| 5,786,259 A | * | 7/1998 | Kang .......................... | 438/396 |

FOREIGN PATENT DOCUMENTS

| | | |
|---|---|---|
| DE | 43 00 808 C1 | 3/1994 |
| EP | 0 412 185 A1 | 2/1991 |
| EP | 0 697 720 A1 | 2/1996 |
| EP | 0 722 190 A2 | 7/1996 |

OTHER PUBLICATIONS

Byoung Taek Lee, et al., IEEE 1997, IEDM 97, pp. 249–252, Samsung Electronics, Co., Integration of (Ba,Sr)TiO$_3$ Capacitor with Platinum Electrodes Having SiO$_2$ Spacer.

Y. Kawamoto, et al., IEEE 1990, 1990 Symposium on VLSI Technology, Central Research Laboratory, Hitachi Ltd., 1.28$\mu m^2$ Bit–Line Shielded Memory Cell Technology for 64Mb DRAMs.

R. B. Khamankar, et al., IEEE 1997, IEDM 97, pp. 245–248, Texas Instruments Incorporated, A Novel BST Storage Capacitor Node Technology Using Platinum Electrodes for Gbit DRAMs.

Y. Nishioka, et al., IEEE 1995, IEDM 95, pp. 903–906, Semiconductor Research Laboratory, ULSI Laboratory, Mitsubishi Electric Corporation, Giga–bit Scale DRAM Cell with New Simple Ru/(Ba,Sr)TiO$_3$/Ru Stacked Capacitors Using X–ray Lithography.

Marc–A. Nicolet, et al., 400 Solid State Technology, 26 (1983) Dec., No. 12, Port Washington, New York, pp. 129–133, California Institute of Technology, Amorphous Metallic Alloys in Semiconductor Contact Metallizations.

S.C. Sun, et al., IEEE 1997, IEDM 97, pp. 253–256, Taiwan Semiconductor Manufacturing Company, et al., Effect of Bottom Electrode Materials on the Electrical and Reliability Characteristics of (Ba,Sr)TiO$_3$ Capacitors.

(List continued on next page.)

*Primary Examiner*—Matthew Smith
*Assistant Examiner*—Renzo N. Rocchegiani
(74) *Attorney, Agent, or Firm*—Schiff Hardin & Waite

(57) ABSTRACT

WSi$_x$, with $0.3<x<0.7$, is used as material for at least one capacitor electrode. Since this conductive material is amorphous up to 800° C., a diffusion of atoms into the capacitor electrode or out of the capacitor electrode does not occur. This property is significant, since a dielectric of the capacitor contains a ferroelectric. The conductive material can be etched easily, providing thick layers to create the capacitor electrode. To increase the capacitance of the capacitor, given a simultaneous high packing density of the circuit arrangement, the capacitor electrode is created with a large surface area and a small cross-sectional area.

8 Claims, 1 Drawing Sheet

OTHER PUBLICATIONS

J. S. Reid, et al., Evaluation of amorphous (Mo, Ta, W)–Si–N diffusion barriers for (Si)/Cu metallizations, Thin Solid Films, Bd. 236, Nr. 1/02, Dec. 15, 1993, pp. 319–324, XP000415529.

Yoshiaki Shimooka, et al., Correlation of W–Si–N Film Microstructure with Barrier Performance against Cu Diffusion, Japanese Journal of Applied Physics, Bd. 36, Nr. 3B, Part 01, Mar. 1997, pp. 1589–1592, XP000703083.

Patent Abstracts of Japan, vol. 096, No. 005, May 31, 1996 & JP 08017822 A (NEC Corp), Jan. 19, 1996.

* cited by examiner

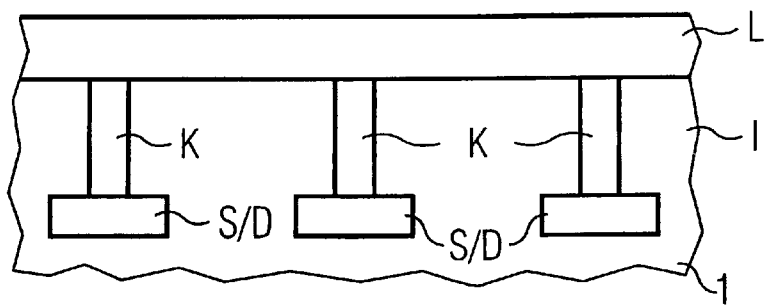
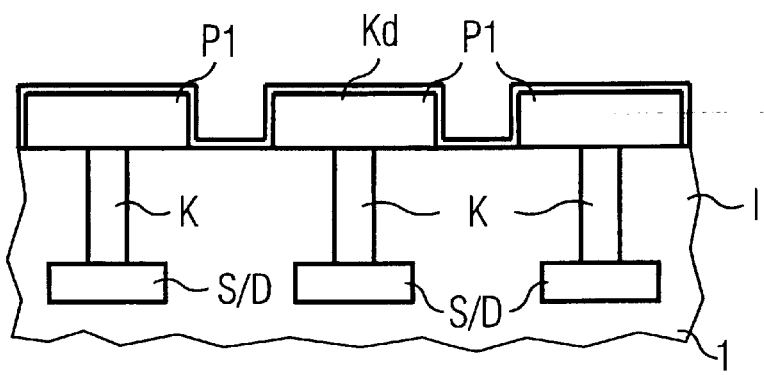
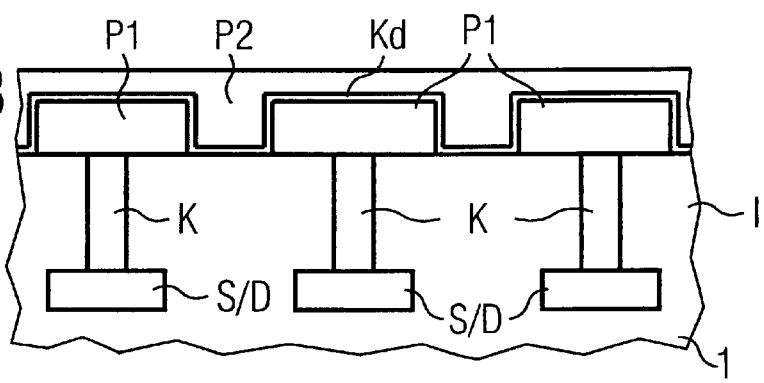
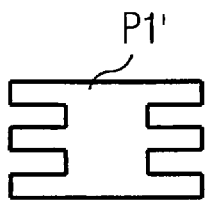

CIRCUIT ARRANGEMENT WITH AT LEAST ONE CAPACITOR

BACKGROUND OF THE INVENTION

The present invention relates to capacitors and in particular to circuit arrangements having capacitors with higher packing density.

With a view to faster and faster components with higher integration densities, the structural sizes of integrated circuit arrangements decrease from generation to generation. For capacitors as components, problems occur as packing density increases because reducing the dimensions of a capacitor reduces the surface area of the capacitor electrodes. As a result, the capacity of the capacitor is diminished.

To solve this problem, capacitor dielectrics with high dielectric constants were developed. Such dielectrics effect a large capacity despite a small surface area of the capacitor electrodes. (See Lee et al, "Integration of (Ba, Sr)TiO$_3$ Capacitor with Platinum Electrodes Having SiO$_2$ Spacer," *Conference Proceedings* IEDM-97, IEEE 1997: 249–252).

In the reference "A 1.28 µm$^2$ Bit-Line Shielded Memory Cell Technology for 64 Mb DRAMs" (Y. Kawamoto et al, *Techn. Digest of VLSI Symposium* 1990: 13 and 14), a DRAM cell arrangement with a capacitor is described, in which a capacitor electrode is constructed as a crown structure. Despite a small cross-sectional area, a crown structure has a large surface area. A crown-shaped capacitor electrode promotes a large capacity of the capacitor, given a simultaneous high packing density. Generally, polysilicon material is used for the capacitor electrode.

In capacitors with dielectrics consisting of barium-strontium-titanate (BST), primarily platinum is currently used as a material for the capacitor electrodes. (See R. B. Khamankar et al., "A Novel BST Storage Capacitor Node Technology Using Platinum Electrodes for Gbit DRAMs," IEDM (1997): 245–248). A disadvantage of using platinum is that a suitable anisotropic etching process having an etching rate of up to 1 µm per minute, which is common in semiconductor production, is still unknown. Due to the slow and incomplete anisotropic etching process, only relatively thin platinum layers can be constructed. At present, it is not possible to create a complicated crown structure from a thick platinum layer for the enlargement of the surface of the capacitor electrodes, and ultimately for increasing the capacity of the capacitor having a simultaneous high packing density.

The use of ruthenium as a material for capacitor electrodes has been proposed in Y. Nishioka et al.'s "Giga-bit DRAM Cell with New Simple Ru/(Ba,Sr)TiO$_3$/Ru Stacked Capacitors Using X-ray Lithography," IEDM (1995) :903–906. However, ruthenium has not yet been incorporated into semiconductor production. As a result, the incorporation of ruthenium entails the risks of contaminants thus reducing the yield. Furthermore, a significant amount of time would be required to develop new production apparatuses in order to utilize ruthenium.

The reference "Amorphous Metallic Alloys in Semiconductor Contact Metallizations" by Mark Nicholett 400 *Solid State Technology* 26 (December 1983, ); Nr. 12; Port Washington, N.Y., teaches the arranging of a thin film made of an amorphous metallic compound between a substrate and a metallizing layer. The thin film prevents the diffusion of atoms from the metallizing layer into the substrate. Amorphous materials do not have grain boundaries which act as rapid diffusion paths for atoms. Rules have been proposed for the selection of elements to obtain amorphous metallic alloys. The combination of these elements yields an amorphous metallic compound. According to these rules, it is particularly important that the atomic size of the elements differ by at least 10%.

A European Patent Document 0 412 185 A1 teaches the use of tungsten and silicon as WSi$_x$, with 0.3<x<0.7, as a material for a thin diffusion barrier which is arranged between a metallizing layer and a GaAs substrate.

A German Patent Document DE 43 00 808 teaches a method for the production of a multilayer capacitor. To produce the capacitor, a multilayer construction is deposited on a substrate. The multilayer construction is made from alternating conductive layers and dielectric layers in which successive conductive layers are formed from one of two different materials that are mutually selectively etchable to each other. Two openings are created in the multi-layer construction. Undercuts are created in the first opening by selective etching of one material, and in the second opening by selective etching of the other (second) material, so that only the conductive layers of the non-etched material are adjacent to contacts built into the openings. It is important that the first material be selectively etchable to the second material. It is proposed that the first material be composed of tungsten and the second material of WSi$_{0.4}$, since WSi$_{0.4}$ comprises distinctive etching characteristics.

SUMMARY OF THE INVENTION

The invention provides a circuit arrangement with at least one capacitor that has a higher packing density and a reduced procedural outlay. The invention also provides a method for producing the same.

To this end, in an embodiment a circuit arrangement has at least one capacitor, in which at least one capacitor electrode of the capacitor contains WSi$_x$ where 0.3<x<0.7 and a capacitor dielectric that contains a ferroelectric.

In an embodiment, the capacitor includes two capacitor electrodes. The first capacitor electrode at least partially includes WSi$_x$, with 0.3<x<0.7. The capacitor also has a capacitor dielectric which contains a ferroelectric. It is within the framework of the invention to have the second capacitor electrode also contain WSi$_x$, with 0.3<x<0.7 as its material. However, the second capacitor electrode need not necessarily contain WSi$_x$ as its material. In such a case, the following applies only to the first capacitor electrode.

An advantage of the present invention is the use of WSi$_x$ as the material for the capacitor electrodes to reduce the procedural outlay.

A further advantage of the present invention is that tungsten W is well-known in semiconductor production and does not represent a contamination risk.

Another advantage of the present invention is that WSi$_x$ can be etched using a conventional production apparatus, thus reducing development costs.

Another advantage of the present invention is that common sputter apparatuses or CVD apparatuses can be used for the creation of WSi$_x$ layers.

To this end, the reduction of the procedural outlay applies particularly if the circuit arrangement is created in substrates which have silicon, such as monocrystalline silicon wafers or SOI substrates.

An exemplifying embodiment of the invention which is depicted in the Figures is detailed below.

BRIEF DESCRIPTION OF THE DRAWINGS

FIG. 1 is a cross-sectional view of a substrate that includes selection transistors, after the creation of an insulating layer, contacts and a first conductive layer.

FIG. 2 is a cross-sectional view of the inventive substrate in FIG. 1 after the structuring of the conductive layer and the creation of a capacitor dielectric.

FIG. 3 is a cross-sectional view of the inventive substrate of FIG. 2 after the creation of a second capacitor electrode.

FIG. 4 is a cross-sectional view of a capacitor electrode.

DETAILED DESCRIPTION OF THE PREFERRED EMBODIMENTS $WSi_x$ can be etched anisotropically with high etching rates. Etching agents that are suitable for such a process generally are gases containing fluorine. Due to the easy etchability of $WSi_x$, thick layers can be structured. This is advantageous, since structures with a large surface area can be created from thick layers, given a simultaneous high packing density. If such a structure serves as a capacitor electrode, its large surface area results in the capacitor having a large capacitance. Generally, the structures are columnar, cuboid or crown-shaped. The structures may also include depressions, projections and/or protuberances.

Unlike shapes whose surfaces only extend in an essentially planar fashion and parallel to the surface of a substrate, the structures have cross-sectional areas which extend parallel to the surface of the substrate and which are considerably smaller than the surfaces of the structures. This is the case when sides of the structure, i.e. surfaces of the structure which extend essentially vertically in relation to the surface of the substrate, constitute a non-negligible percentage of the total area of the structure. The structures can be raised, i.e., their dimension perpendicular to the surface of the substrate can equal more than about 100 nm.

Essentially, $WSi_x$, with $0.3<x<0.7$, is in an amorphous state up to approximately 800° C. The capacitor electrodes can be arranged directly adjacent to the capacitor dielectric without material diffusing out of or into the capacitor dielectric. As a result, it is possible to use materials with high dielectric constants, such as ferroelectrics, for the capacitor dielectric, even if they diffuse easily. Such ferroelectrics include BST (barium strontium titanate), SBT (strontium bismuth tantalate), PZT (lead zirconium titanate) or BMF (barium magnesium fluoride).

Since $WSi_x$, with $0.3<x<0.7$, remains stable up to approximately 800° C., procedural steps involving high temperatures can occur after the creation of the capacitor electrodes. This is particularly the case when the capacitor dielectric is created from BST on the first or the second capacitor electrode. A thermal post-treatment with over 400° C. is necessary so that the capacitor dielectric is stabilized in the state with the high dielectric constant.

Another advantage of using $WSi_x$ with $0.3<x<0.7$ is that in procedural steps involving heating performed in an oxygenic atmosphere, the oxidation of the capacitor electrodes is minimal, since the $WSi_x$ is chemically saturated, and its oxygen affinity is low. Such procedural steps are usually required for the creation of all capacitor dielectrics with high dielectric constants (cf. S. Sun and M. Tai, "Effect of Bottom Electrode Materials on the Electrical and Reliability Characteristics of $(Ba, Sr)TiO_3$ Capacitors).

To stabilize the amorphous state of the $WSi_x$ with $0.3<x<0.7$, it is advantageous to nitrify this material. This occurs because the $WSi_x$ is sputtered reactively, i.e. in a gas compound containing $N_2$. Such a process usually exits given a gas pressure of an $Ar/N_2$ mixture of about 1 to 20 mTorr. The $N_2$ portion can be varied for process optimization with respect to the N content of the sputtered material and to its stress. For example, the N portion can be 50%. Given the use of a CVD method, it is possible to add $NH_3$ to the utilized gas mixture, which leads to the embedding of N in the material during the deposition process.

An inventive circuit arrangement is particularly one with a memory function.

An inventive circuit arrangement is particularly suitable as DRAM cell arrangement. In this case, the capacitor is connected to at least one transistor. The transistor can be a selection transistor which is connected to word and bit lines that serve for the read-out and read-in of information. Transistors of the DRAM cell arrangement can be planar or vertical.

The capacitor can comprise a cross-section which is less than or equal to $4F^2$, in which F is the minimum structural size which can be produced in the utilized technology.

It is within the framework of the invention to create a part of the capacitor electrode which is not adjacent to the capacitor dielectric from a different conductive material, such as doped polysilicon, titanium nitride, silicides, metals such as tungsten, titanium, cobalt or molybdenum, or from alloys.

FIG. 1 shows a substrate 1, which contains monocrystalline silicon, including selection transistors of a DRAM cell arrangement whose gate electrodes are connected to word lines (not shown). The selection transistors have source/drain regions S/D. An insulating layer I is deposited on the substrate 1, creating contacts K to the source/drain regions S/D of the selection transistors in layer I (see FIG. 1).

$WSi_{0.4}$ is subsequently deposited in a thickness of about 300 nm by sputtering, and creates a conductive layer L (see FIG. 1).

In FIG. 2, $WSi_{0.4}$ is etched with $CF_4$, for example, with the aid of a mask (not shown) which overlaps the contacts K until the insulating layer I is exposed. A first capacitor electrode P1 emerges from the conductive layer L. The sides of the first capacitor electrode P1 are about 300 nm high.

To create a capacitor dielectric Kd, BST is deposited in a thickness of about 30 nm.

FIG. 3 shows a second capacitor electrodes P2. Second capacitor electrodes P2 are created by depositing $WSi_{0.4}$ in a thickness of about 100 nm and planarizing the $WSi_{0.4}$ by chemical-mechanical polishing. The second capacitor electrodes P2 form a continuous capacitor plate.

There are many conceivable variations of the exemplifying embodiment within the framework of the invention. In particular, the thicknesses of the described layers and structures can be adapted based on the requirements needed. In FIG. 4, for example, the first capacitor electrode P1' can be created in the shape of a crown structure. In order to enlarge its surface, the electrode can be designed with protrusions, protuberances or depressions. Instead of $WSi_{0.4}$, $WSi_x$ can be used, with $0.3<x<0.7$. $WSi_x$ can be nitrated. Instead of BST, other materials can be used for the capacitor dielectric. The second capacitor electrodes can be connected to bit lines. In this case, they do not form a continuous capacitor plate.

I claim:

1. A circuit arrangement comprising:
   a substrate having a surface with at least one capacitor, said capacitor comprising at least one capacitor electrode of a diffusion barrier material comprising a nitrified amorphous $WSi_x$, wherein x is an atomic percent and has a value such that $0.3<x<0.7$, and a capacitor dielectric comprising a ferroelectric material, said electrode being arranged directly adjacent the capacitor dielectric.

2. A circuit arrangement as defined in claim 1, wherein the capacitor dielectric ferroelectric material comprises barium strontium titanate.

3. A circuit arrangement as defined in claim 1, wherein the capacitor electrode includes a portion extending perpendicular to the surface of the substrate having a length dimension of at least about 100 nm.

4. A circuit arrangement as defined in claim 3, in which the capacitor electrode has a configuration comprising protuberances, projections and/or depressions.

5. A circuit arrangement as defined in claim 1, wherein the substrate comprises silicon.

6. A circuit arrangement as defined in claim 1, comprising a DRAM cell arrangement.

7. A circuit arrangement comprising:
a silicon substrate having a surface with at least one capacitor, said capacitor having a pair of capacitor electrodes with a capacitor dielectric comprising a ferroelectric material therebetween, said capacitor electrodes being arranged directly adjacent the capacitor dielectric and being of a diffusion barrier to the ferroelectric material and consisting of a nitrified amorphous $WSi_x$, wherein x is an atomic percent and has a value of $0.3<x<0.7$.

8. A circuit arrangement as defined in claim 7, wherein the capacitor dielectric ferroelectric material comprises barium strontium titanate.

* * * * *